United States Patent [19]

Theus et al.

[11] Patent Number: 4,810,912
[45] Date of Patent: Mar. 7, 1989

[54] CURRENT SWITCH

[75] Inventors: Ulrich Theus, Gundelfingen, Fed. Rep. of Germany; Paul O'Leary, Graz, Austria

[73] Assignee: Deutsche ITT Industries GmbH, Freiburg, Fed. Rep. of Germany

[21] Appl. No.: 120,452

[22] Filed: Nov. 13, 1987

[30] Foreign Application Priority Data

Dec. 1, 1986 [EP] European Pat. Off. .......... 86116665

[51] Int. Cl.⁴ .................... H03K 17/04; H03K 17/687
[52] U.S. Cl. ..................................... 307/585; 307/262; 307/254
[58] Field of Search ............... 307/353, 571, 585, 262, 307/246, 576, 228, 270, 254

[56] References Cited

U.S. PATENT DOCUMENTS 3,839,679 10/1974 Hughes ............................. 307/228
4,228,366 10/1980 Hüttemann et al. ................ 307/228
4,527,133 7/1985 Money ................................ 332/11

FOREIGN PATENT DOCUMENTS 2845598 4/1979 Fed. Rep. of Germany .

OTHER PUBLICATIONS

"IEEE Transactions on Industrial Electronics and Control Instrumentation", a Nonlinear Modulator Using Delta Modulation Principles, by Satish Mullick and D. R. Srivathsan, vol. 22, No. 3, Aug. 1975, pp.385-390.
1974 IEEE International Solid-State Circuits Conference, Feb. 14, 1974, "A Linear Delta Modulator/Demodulator with 10 Mbit/S Sampling Rate", Gary L. Baldwin.
"Digitale MOS-Technik", *Mos–Integrierbare Digital–Analog–Wandler, Teil. Das Impulsdauerverfahren (Tastzeitverhaltnisverfahren)*, R. Reiner, pp. 180-184, No. 7, 1975.

Primary Examiner—John Zazworsky
Attorney, Agent, or Firm—Thomas L. Peterson

[57] ABSTRACT

A current switch for use in digital-to-analog converters having high dynamic accuracy includes first and second electronic switches, the first of which connects either a constant-current source or a constant-current sink to an output terminal. The output terminal is connected to a low-pass filter. When the constant-current source is connected to the output terminal, the second switch connects the constant-current sink to a reference-voltage source. When the constant current sink is connected to the output terminal, the second electronic switch connects the constant current source to the reference-voltage terminal. This antiphase switching of the two electronic switches is controlled by a control circuit to which a clocked signal and a clock signal are applied. The clocked signal is, for example, a pulse-density-modulated signal which appears as a demodulated signal at the output of the low-pass filter. Switching is accomplished by limiting the swing of the control signals and using a control characteristic symmetrical with respect to the two switching edges.

7 Claims, 2 Drawing Sheets 4,810,912

CURRENT SWITCH

BACKGROUND OF THE INVENTION

1. Field of the Invention

The present invention relates to current switches such as may be part of an analog-to-digital or digital-to-analog converter circuit using delta modulation.

2. Description of the Prior Art

Current switches are often used in analog-to-digital and digital-to-analog converters which use delta modulation. In such converters, the logic level of the data and an associated clock signal determine the state of such a current switch, whose output is smoothed by means of an integrator and a low-pass filter to form the analog output signal. A current switch of this kind is described in "1974 IEEE International Solid-State Circuits Conference Digest of Technical Papers," February, 1974, pp. 192/193.

Such current switches are also suitable for demodulating pulse-duration-modulated signals; in which case, the low-pass-filtered output of the current switch is the demodulated output signal.

Such demodulators suffer from the drawback that the leading and trailing edges of the output current of the current switch affect the analog output signal, which is formed by integrating the switched current over several clock periods. Thus, edge distortions which do not average out in the integral will result in a spurious output, such as distortion or noise. This disadvantageous behavior is described, for example, in "Funk-Technik," 1975, pages 180 to 184, especially Chapter 1.5.3, page 184, with FIG. 9.

If, during the demodulation of a pulse-density-modulated signal, the required signal-to-noise ratio of, e.g., 85 dB for an audio signal of 0–16 kHz is to be maintained, it is required that, at a clock rate of 5 MHz, the effective time deviation per leading or trailing edge of the switched current, corresponding to the integral error, must not be greater than 100 ps. As a comparison, the corresponding aperture time of a weighted digital-to-analog converter with a 14-bit dynamic range at a 85-dB signal-to-noise ratio is about 500 ps.

SUMMARY OF THE INVENTION

It is, therefore, the object of the invention as claimed to improve the above-described current switch in such a way that for each switching edge, the edge-induced error in the current integral corresponds to an effective switching-time error of not more than about 50 ps if, for temporal estimation, the shape of the switching edge is assumed to be ideal.

An important advantage of the invention lies in the fact that the required accuracy is achieved without the usual return-to-zero technique, in which the clock rate must be doubled, and in which, regardless of the previous logic state, the leading and trailing edges always begin at a zero reference level or at a fixed additional intermediate level. Thus, the current switch in accordance with the invention is suitable for both digital-to-analog and analog-to-digital conversion in pulse-width-modulation, pulse-density-modulation, and delta-modulation circuits. In addition, it is suitable for use as a current switch in digital-to-analog converters with high dynamic accuracy.

Another advantage of the invention is that the current switch is suitable for monolithic integration, so that parasitic capacitances and inductances are minimized, which contributes to the high switching speed and switching accuracy.

A further advantage of the invention lies in the fact that only a constant current flows in the supply-voltage leads, so that even at high clock rates, no steep-edge pulses will occur which might induce electromagnetic interference.

BRIEF DESCRIPTION OF THE DRAWINGS

The invention will now be explained in greater detail with reference to the accompanying drawings, in which.

DETAILED DESCRIPTION

Figure 1:
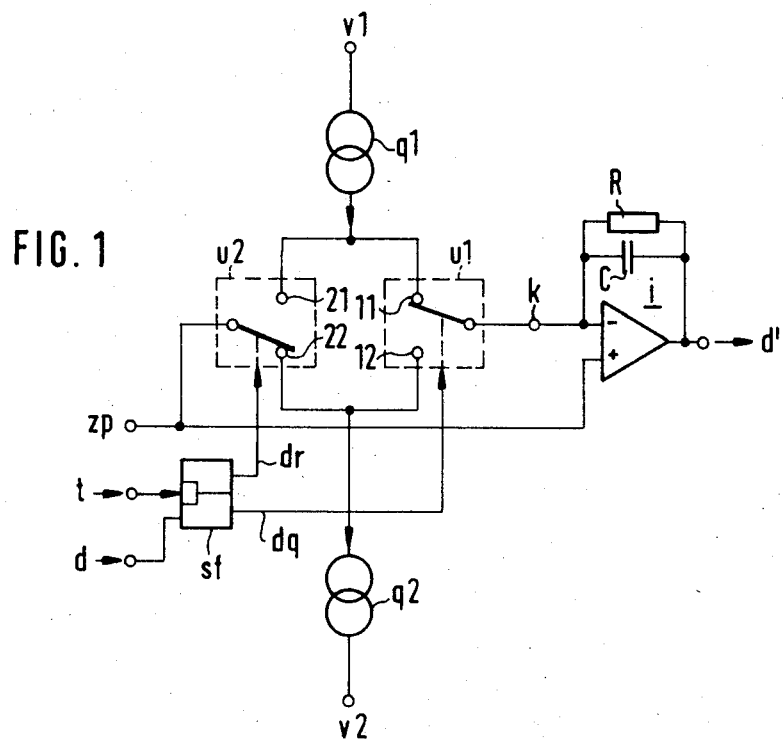
FIG. 1 is a schematic circuit diagram of the current switch with a low-pass filter connected thereto.

In FIG. 1, the current switch contains a first electronic switch u1 and a second electronic switch u2. The first inputs 11, 21 and the second inputs 12, 22 of these switches are connected together, and the junctions are connected to a constant-current source q1 and a constant-current sink q2, respectively. A first terminal of the constant-current source q1 is connected to a first supply-voltage terminal v1, and a first terminal of the constant-current sink q2 is connected to a second supply-voltage terminal v2.

In the case of the outputs of the first and second electronic switches u1, u2, it must be ensured, on the one hand, that the two terminals are, as far as possible, at the same potential to achieve a good circuit balance, and, on the other hand, that the voltage swings of the two outputs are as small as possible, so that the high resistance of the constant-current source q1 or the constant-current sink q2 is fully preserved. Both aims are achieved by connecting the outputs of the first and second electronic switches u1, u2 directly or indirectly to the reference potential zp, which lies in the middle between the potentials of the first and second supply-voltage terminals v1, v2.

The output of the first electronic switch u1 feeds the output terminal k, to which the inverting signal input of the active low-pass filter i is connected. Since the noninverting input is connected to the reference-potential terminal zp, the inverting input represents a low-resistance terminal at the reference potential zp. The RC section of the active low-pass filter i is contained in the filter's feedback path.

The first and second electronic switches u1, u2 are controlled so as to be operated in phase opposition. When, for example, the first electronic switch u1 supplies the output terminal k with current from the constant-current source q1, current from the reference-potential terminal zp flows through the second electronic switch u2 and the constant-current sink q2 to the second supply-voltage terminal v2. In the other switch position, the current from the constant-current source q1 flows through the electronic switch u2 to the reference-potential terminal zp, while the constant-current sink q2 draws current from the output terminal k and, thus, from the low-pass filter i via the first electronic switch u1.

The two electronic switches u1, u2 are controlled by the control circuit sf, to which the digital signal is applied as a clocked signal d. In the simplest case, the control circuit sf is a D flip-flop which transfers the signal at the D input, the clocked signal d, at the clock frequency. The outputs of the control circuit sf are the signal dr, which is in phase with the clocked signal d, and the inverted signal dq.

The control input of the first electronic switch u1 is fed with the inverted signal dq. In the switch position shown, the constant-current source q1 is connected to the output terminal k. The control input of the second electronic switch u2 is fed with the signal dr, which is in phase with the clocked signal d. In the switch position shown, the output terminal of this switch is connected to the constant-current sink q2.

The control circuit sf is also supplied with the clock signal t. Upon arrival of an edge of the clock signal t, the two outputs of the control circuit sf will change state. This ensures that the instants of switching of the electronic switches u1, u2 are independent of any disturbed edges of the clocked signal d.

A circuit acting in a manner similar to that in the embodiment of FIG. 1 is achieved by replacing both the constant-current source q1 and the constant-current sink q2 with a voltage source and inserting a current-limiting resistor in the output line of each of the two electronic switches u1, u2, the two resistors having equal values.

In the schematic embodiment of FIG. 1, the individual switching functions can be realized using either bipolar or MOS technology or even a combined technology. As is well known, at very high clock frequencies, bipolar transistors have advantages over MOS transistors in terms of switching speed, while MOS transistors have advantages at medium and low frequencies because of their wattless switching operation. Another aspect is a comparison of the symmetry of the electrical characteristics, which must be taken into consideration when choosing between bipolar and MOS technology.

Figure 2:
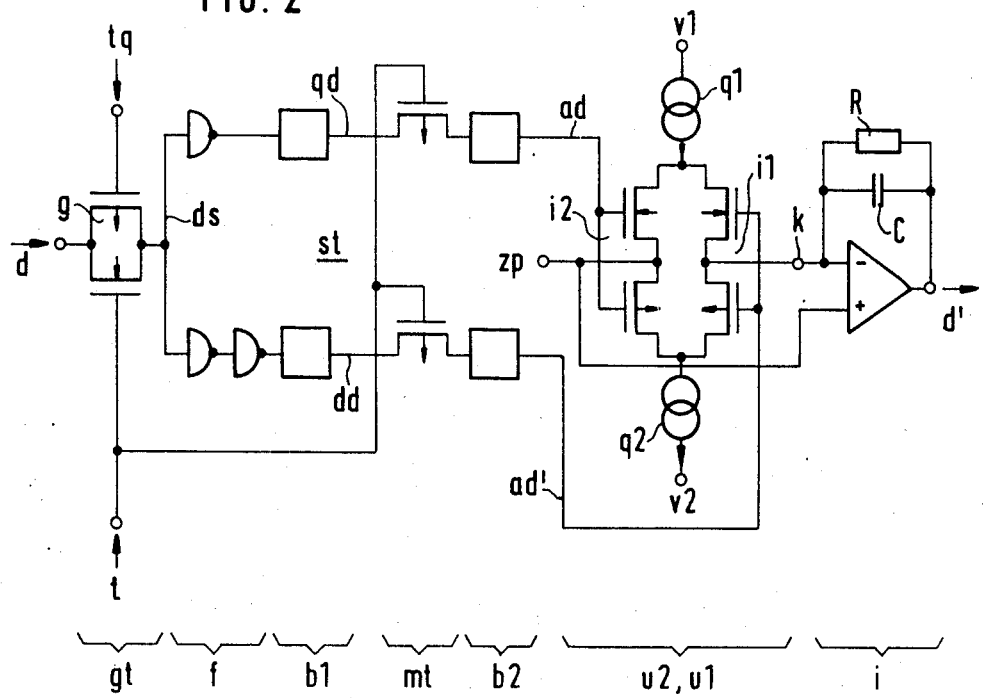
FIG. 2 is a block diagram of an embodiment of the current switch.

The embodiment of FIG. 2, which is partly in the form of a block diagram, shows the individual functional units of a current switch in accordance with the invention, which are realized in part using CMOS technology. The control stage st contains a gate circuit gt controlled by the direct clock signal t and the inverted clock signal tq, a gate circuit mt controlled by the direct clock signal t, an inverter f and swing limiter circuits b1, b2. The current switch consists of two CMOS inverters i1 and i2. Unlike normal CMOS inverters, however, the CMOS inverter i1 is connected to the first supply-voltage terminal v1 through a common constant-current source q1, and the CMOS inverter i2 is connected to the second supply-voltage terminal v2 through a common constant-current sink q2.

The output of the first inverter i1 is connected via the output terminal k to the active low-pass filter i, and the output of the second inverter is connected to a fixed-potential terminal, the reference potential zp. The control circuit st controls the first and second inverters i1, i2 with its two oppositely phased output signals ad', ad, so that either the current of the constant-current source q1 or that of the constant-current sink q2 is connected to the output terminal k. The optimum symmetry in the generation of the two oppositely phased control signals ad', ad, together with the symmetry of the first and second inverters i1, i2, is to cause the current transfer from the first and second inverters i1, i to follow a symmetrical characteristic, particularly in the transition region, whereby the above-described integral error is eliminated as far as possible.

For the same purpose, namely the symmetrization of the current-transfer characteristic, the two swing limiter circuits b1, b2 in the control lines are provided, which are not found in conventional converter control circuits. While slightly slowing down the switching operation, they cause the entire switching operation to proceed in a defined manner and stationarily, so to peak, on the basis of the undisturbed static control characteristics of the transistors, because the outputs of all transistors involved remain in a high impedance state. MOS transistors thus remain saturated, and bipolar transistors remain in the unsaturated region, namely in the linear region.

The input gate gt, in the embodiment shows the transfer gate g, which is opened by the inverted clock signal tq, and the second gate mt, which combine to act as a master-slave flip-flop which samples the clocked signal d. The signal ds, which is stable in logic level, feeds the interface circuit f, which generates primarily the signal qd, which is inverted with respect to the stable signal ds, and the corresponding uninverted signal dd. The interface circuit f also serves to obtain an impedance match and to match the logic level of the applied clocked signal d to the subsequent processing.

The first swing-limiting circuit b1 limits the swing of the two clocked signals dd, qd after the interface circuit f, so that already the following second swing-limiting and level-adapting circuit b2 is controlled statically, so to speak, with a defined anti-phase control characteristic similar to the above-described symmetrical transfer characteristic. The second swing-limiting and level-adapting circuit b2 then determines the precise operating point and the precisely limited swing of the two oppositely phased control signals ad', ad for the first and second inverters i1, i2, of the current switch.

The timing of the current switching is effected by the second gate circuit mt, which is opened by the clock signal t. This gate circuit consists, for example, of two n-channel transfer transistors which are inserted in the two signal paths between the first and second swing limiter circuits b1, b2 and are controlled by the clock signal t. The second gate circuit mt and the first swing limiter circuit b1 may also be transposed.

At very high bit rates of the clock signal t, it may be necessary to change the embodiment of FIG. 2 to pure ECL technology or to a combination of bipolar and MOS technology.

Figure 3:
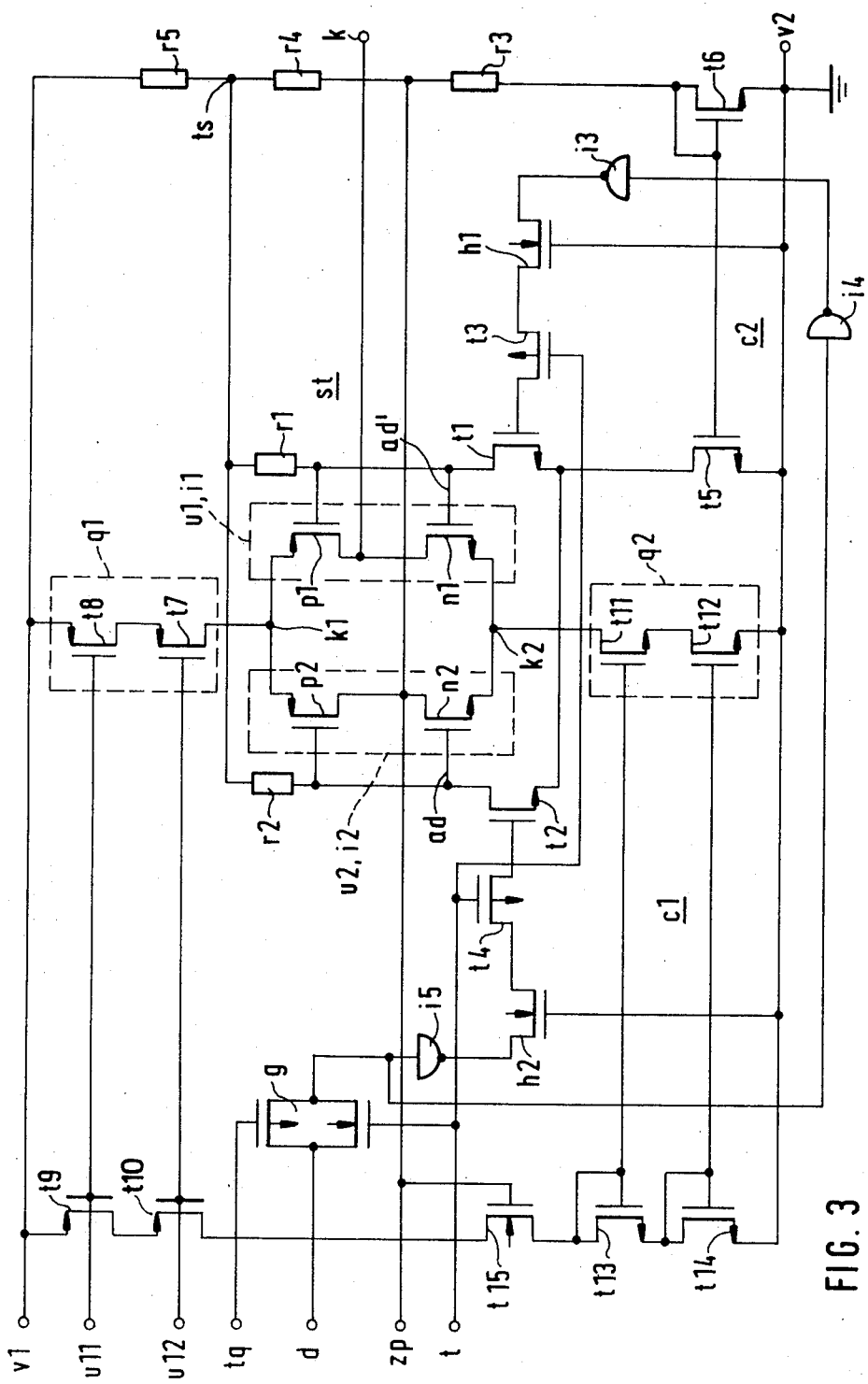
FIG. 3 shows an embodiment of the current switch of FIG. 2 in CMOS technology.

In the CMOS embodiment of the current switch of FIG. 3, the first electronic switch u1 is formed by the first inverter i1, and the second electronic switch u2 by the second inverter i2. The source terminal of the first p-channel inverter transistor p1 and that of the second p-channel inverter transistor p2 are connected together, and the junction point is connected via the constant-current source q1 to the first supply-voltage terminal v1, which for example, has a voltage of 8.5 volts applied to it. The source terminals of the first and second n-channel inverter transistors n1, n2 are connected together, and the junction point is connected via the constant-current sink q2 to the second supply-voltage terminal v2, which is for example, at zero potential.

Thus, the source terminals of the first and second p-channel inverter transistors p1, p2 correspond to the first inputs 11, 21 of the first electronic switch u1 and the second electronic switch u2, respectively, and the source terminals of the first and second n-channel inverters n1, n2 correspond to the second inputs 12, 22 of these switches. Furthermore, the inverter inputs formed by the two gate terminals of the first and second inverters i1, i2 correspond to the control inputs of the first electronic switch u1 and the second electronic switch u2, respectively.

The output of the first inverter i1 is coupled to the output terminal k, and the output of the second inverter i2 is connected to the terminal for the reference potential zp, which for example, has a voltage of 4 volts applied to it.

The inputs of the first and second inverters i1, i2 are connected to the drain terminals of the first n-channel transistor t1 and the second n-channel transistor t2, respectively, which form a difference stage, because their two source terminals are connected together. The gate terminals of the first and second n-channel transistors t1, t2 are controlled via the first n-channel transfer transistor t3 and the second n-channel transfer transistor t4, respectively, which each form a series switch controlled by the clock signal t. The first and second n-channel transfer transistors t3, t4 are in turn controlled via the first p-channel transfer transistor h1 and the second p-channel transfer transistor h2, respectively. The gate terminals of the two p-channel transfer transistors h1, h2 are connected to the second supply-voltage terminal v2.

By these two p-channel transfer transistors h1, h2, the swing of the applied control signal is reduced from, e.g., about 4 volts to 1 volt. The clocked signal d is applied to the source terminal of the first p-channel transfer transistor h1 through the series combination of the third and fourth inverters i3, i4, and to the source terminal of the second p-channel transfer transistor h2 through the fifth inverter i5. Thus, the output signal ad' of the first n-channel transistor t1 corresponds to the inverted clock signal dq, and the output signal ad of the second n-channel transistor t2 to the clocked signal d. Since the clocked signal d may be applied over a long line and, thus, may be disturbed, the control-circuit input for the clocked signal d contains the transfer gate g, which is rendered conductive by the inverted clock signal tq.

The load resistors of the first and second n-channel transistors t1, t2 of the difference stage are the first and second load resistors r1, r2 in the respective drain leads. The terminals of the two load resistors r1, r2 remote from the drains are connected together, and the junction is connected to the voltage-divider tap ts between the first supply-voltage terminal v1 and the reference-potential terminal zp. By selecting suitable values for the fourth and fifth resistors r4, r5 of the voltage divider and for the first and second load resistors r1, r2, the voltage swing across these two resistors is determined. Exemplary resistance values for one embodiment of the present invention are set forth in Table A, below.

By limiting the swing to, e.g., 1 volt, the transistors of the constant-current source or sink q1, q2 are kept in saturation.

The first and second inverters i1, i2 of the control circuit st just described must be made as electrically symmetrical as possible.

Furthermore, the transistors of the first and second inverters i1, i2 must be made as small as possible so as to minimize the switching currents caused by the gate charge reversal, because these currents flow off through the inverter outputs in an uncontrolled manner. In addition, the channel lengths of the p-channel and n-channel inverter transistors p1, p2, n1, n2 should be adapted to the pulse rise and decay times of the switching signals at the first and second load resistors r1, r2. Moreover, the low drive level of the complementary current switch, which consists of the two inverters i1, i2, permits a space-saving direct connection of the gate terminals of the associated p-channel and n-channel inverter transistors p1, n1, p2, n2, because the need for the normally used bootstrap driver stages is eliminated. This, too, contributes to the electrical symmetry and, thus, the similar behavior of the first and second inverters i1, i2.

The constant-current source q1 is designed as a cascode circuit and consists of the series combination of the seventh and eighth p-channel transistors t7, t8. One of the terminals of the series combination, the source terminal of the eighth p-channel transistor t8, is connected to the supply-voltage terminal v1, and the other to the source terminals of the first and second p-channel inverter transistors p1, p2, thus forming the first node k1. The gate terminal of the eighth p-channel transistor t8 is connected to the gate terminal of the ninth p-channel transistor t9 and to the first terminal u11 of the first bias source. The gate terminal of the seventh p-channel transistor t7 is connected to the gate of the tenth p-channel transistor t10 and to the second terminal u12 of the first bias source. The ninth and tenth p-channel transistors t9, t10, which are connected in a cascode configuration, are identical in design with the eighth p-channel transistor t8 and the seventh p-channel transistor t7, respectively, with the source terminal of the ninth p-channel transistor t9 connected to the first supply-voltage terminal v1.

The width-to-length ratios (w/l) of these four p-channel transistors t7, t8, t9, t10 are chosen so that, seen from the first node k1, the constant-current source q1 becomes as high impedance as possible. This is achieved by means of the cascode circuit consisting of the seventh and eighth p-channel transistor t7, t8 and by making the width-to-length ratio of the seventh p-channel transistor t7 greater than that of the eighth p-channel transistor t8. Exemplary width-to-length ratios for the transistors are set forth in Table B, below.

The constant-current sink q2 is a cascode circuit formed by the series combination of two n-channel transistors, namely the eleventh and twelfth n-channel transistors t11, t12. The source terminal of the eleventh n-channel transistor t11 is connected to the second node k2, which is also the point of connection of the two source terminals of the first and second n-channel inverter transistors n1, n2. The source terminal of the twelfth n-channel transistor t12 is the low end of the constant-current sink q2 and as such is connected to the second supply-voltage terminal v2.

The gate terminal of the eleventh n-channel transistor t11 is connected to the gate terminal of the thirteenth n-channel transistor t13, and the gate terminal of the twelfth n-channel transistor t12 to the gate terminal of the fourteenth n-channel transistor t14, the transistors t13 and t14 being identical in design with the transistors t11 and t12, respectively. The n-channel transistors t13, t14 are connected in a cascode configuration, with the source terminal of the n-channel transistor t14 connected to the second supply-voltage terminal v2. The cascode connection of the two n-channel transistors t13, t14 also represents the second bias source for the constant-current sink q2, because these two n-channel transistors are connected as diodes (drain and gate interconnected). As the associated transistors of the constant-current sink q2 and the two series-connected diodes are alike, these four n-channel transistors t11, t12, t13, t14 form the first n-channel current-mirror circuit c1. The input of this circuit is the drain-gate connection of the n-channel transistor t13, and the output is the drain terminal of the n-channel transistor t11. As a result of the cascode connection of the transistors of suitable width-to-length ratio (see, for example, Table B), the first n-channel current-mirror circuit c1 has a very high output resistance.

To make the currents of the constant-current source q1 and the constant-current sink q2 equal to one another, the first n-channel current-mirror circuit c1 is fed with a current which is equal to the output current of the constant-current source q1. This current is the current from the series combination of the p-channel transistors t9, t10, and is supplied to the input of the first n-channel current-mirror circuit c1. Conversely, the constant-current source q1 can be designed as a p-channel current-mirror circuit which is then fed with an output current equal to the current of the constant-current sink q2.

To make the potential at the drain terminal of the p-channel transistor t10 approximately equal to the potential of the first node k1, the source-drain paths of a p-channel transistor, namely the fifteenth p-channel transistor t15, is interposed between the p-channel transistor t10 and the n-channel transistor t13. The gate terminal of the p-channel transistor t15 is connected to the reference potential terminal zp.

With the potential of the first and second supply-voltage terminals u11, u12 of the first bias source, which are implemented on the chip as separate voltage-reference sources, for example, the current of the constant-current source q1 and, thus, the current of the constant-current sink q2 can be set.

The control stage st contains the second n-channel current-mirror circuit c2. In its simplest form, the latter consists of two interconnected n-channel transistors of the same design. The output is the drain terminal of the fifth n-channel transistor t5, which is connected to the interconnecting lead between the source terminals of the n-channel transistors t1, t2. The gate of the n-channel transistor t5 is connected to the gate and the drain of the sixth n-channel transistor t6. The drain current of the n-channel transistor t6 is determined by the resistor r3, which is connected between the drain terminal of this resistor and the reference-potential terminal zp.

Exemplary resistance values for the resistors r1, r2, r3, r4 and r5 are as follows:

TABLE A

| r1 - 17k | r4 - 7k |
|---|---|
| r2 - 17k | r5 - 40k |
| r3 - 62k | |

Exemplary width-to-length ratios for the transistors described above are as follows:

TABLE B

| t1 - 18/3 | t11 - 36/5 |
|---|---|
| t2 - 18/3 | t12 - 36/60 |
| t3 - 6/3 | t13 - 36/5 |
| t4 - 6/3 | t14 - 36/60 |
| t5 - 45/5 | t15 - 22/3 |
| t6 - 45/5 | g - 3.5/3 |
| t7 - 22/5 | p1 - 20/4 |
| t8 - 22/10 | p2 - 20/4 |
| t9 - 22/10 | n1 - 8/4 |

TABLE B-continued

| t10 - 22/5 | n2 - 8/4 |
|---|---|

What is claimed is:

1. A current switch, comprising:
   a constant current source comprising a first current source connected to a first input voltage terminal;
   a constant current sink comprising a second current source connected to a second input voltage terminal;
   a reference voltage bus connected to a reference voltage input terminal, said reference voltage input terminal connectable to a reference voltage source;
   an output terminal;
   a first electronic switch comprising:
      a first input connected to said constant current source;
      a second input connected to said constant current sink; and
      an output connected to said output terminal;
   a second electronic switch comprising:
      a first input connected to said constant current source;
      a second input connected to said constant current sink; and
      an output connected to said reference voltage bus; and
   a control circuit that controls said first electronic switch and said second electronic switch in phase opposition, said control circuit having a first control output signal that controls said first electronic switch and having a second control output signal that controls said second electronic switch, said first control output signal and said second control output signal being in phase opposition such that:
      the output of said first electronic switch is electrically connected to said first input of said first electronic switch to receive current from said constant current source when said output of said second electronic switch is electrically connected to said second input of said second electronic switch to provide current to said constant current sink, and
      the output of said first electronic switch is connected to the second input of said first electronic switch to provide current to said constant current sink when said output of said second electronic switch is electrically connected to said first input of said second electronic switch to receive current from said constant current source.

2. A current switch as defined in claim 1 wherein said control circuit is fed with a clocked signal and a clock signal, said clock signal synchronizing said clocked signal so that said clocked signal controls said electronic switches in synchronism with said clock signal.

3. A current switch as defined in claim 1 wherein the first electronic switch comprises a first inverter and the second electronic switch comprises a second inverter, each of said first inverter and second inverter comprising:
   an n-channel inverter transistor, having a source, drain and gate terminal; and
   a p-channel inverter transistor, having a source, drain and gate terminal,
   wherein:

the source terminal of each of said p-channel inverter transistors being the first input of the respective electronic switch, the source terminal of each of said n-channel inverter transistors being the second input of the respective electronic switch, the drains of said n-channel and p-channel transistors of said first electronic switch being electrically interconnected to each other and connected to said output terminal, and the drains of said n-channel and p-channel transistors of said second electronic switch being electrically interconnected and connected to said voltage reference bus.

4. A current switch as defined in claim 3 wherein the control circuit comprises a difference stage, said difference stage comprising a first n-channel transistor and a second n-channel transistor each having a source, drain and gate terminal, and wherein:

the source terminals of said first and second n-channel transistors are connected to a first load resistor and a second load resistor respectively, and the gate terminal of said first n-channel transistor is fed with a signal in phase with the clocked signal.

5. A current switch as defined in claim 1 wherein:

said constant-current source includes at least one p-channel transistor having a source, gate and drain terminal, the gate terminal of said p-channel transistor being connected to a first bias source, and said constant-current sink includes at least one n-channel transistor having a source, gate and drain terminal, the gate terminal of said n-channel transistor being connected to a second bias source.

6. A current switch as defined in claim 5, wherein:

said first bias source and said p-channel transistor of said constant-current source form part of a p-channel current-mirror circuit, and said second bias source and said n-channel transistor of said constant-current sink form part of a first n-channel current-mirror circuit.

7. A current switch as defined in claim 1, wherein:

said first current source and said second current source comprise a first voltage source and a second voltage source, respectively;

a first resistor is connected between the output of said first electronic switch and said output terminal;

a second resistor substantially equal in value to said first resistor is connected between the output of said second electronic switch and said reference voltage bus; and said reference voltage bus provides a reference potential voltage, the magnitude of the reference potential voltage selected to be substantially equal to the mean value of the voltage potentials of said first and second voltage sources.

* * * * *